(12) United States Patent
Hatanaka

(10) Patent No.: US 7,066,196 B2
(45) Date of Patent: Jun. 27, 2006

(54) ASSEMBLING STRUCTURE FOR PRESSURE SENSOR INTEGRALLY FORMED WITH ELECTROMAGNETIC VALVE

(75) Inventor: Makoto Hatanaka, Handa (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/208,605

(22) Filed: Aug. 23, 2005

(65) Prior Publication Data

US 2006/0054220 A1    Mar. 16, 2006

(30) Foreign Application Priority Data

Sep. 14, 2004    (JP) ............................. 2004-266691

(51) Int. Cl.
*F16K 31/06*    (2006.01)
(52) U.S. Cl. .............................. 137/315.03; 137/15.01; 251/129.04; 251/129.06
(58) Field of Classification Search ............ 137/15.01, 137/315.01; 251/129.04, 129.06
See application file for complete search history.

(56) References Cited

U.S. PATENT DOCUMENTS

| 4,852,010 | A | * | 7/1989 | Amano et al. ............... 137/343 |
| 5,620,019 | A | * | 4/1997 | Nicolaisen ............. 137/315.03 |
| 6,554,375 | B1 | | 4/2003 | Dinkel et al. |
| 6,745,634 | B1 | | 6/2004 | Beck et al. |
| 6,773,078 | B1 | | 8/2004 | Dinkel et al. |

* cited by examiner

*Primary Examiner*—A. Michael Chambers
(74) *Attorney, Agent, or Firm*—Posz Law Group, PLC

(57) ABSTRACT

In an assembling structure for assembling a pressure sensor device to a solenoid, the pressure sensor device comprises a pressure sensor and an electromagnetic valve, and the solenoid is electrically connected to an electrical circuit device and has a cylindrical inner space. The pressure sensor device is detachably inserted into the cylindrical inner space of the solenoid. The pressure sensor has a first set of terminals, whereas a second set of terminals is provided to the solenoid, wherein the first set of the terminals is respectively and electrically connected to the second set of the terminals through spring contact.

9 Claims, 13 Drawing Sheets

ASSEMBLING STRUCTURE FOR PRESSURE SENSOR INTEGRALLY FORMED WITH ELECTROMAGNETIC VALVE

CROSS REFERENCE TO RELATED APPLICATION

This application is based on Japanese Patent Application No. 2004-266691, which is filed on Sep. 14, 2004, the disclosure of which is incorporated herein by reference.

FIELD OF THE INVENTION

The present invention relates to an assembling structure for a pressure sensor, which is integrally formed with an electromagnetic valve, more specifically relates to an assembling structure for assembling the pressure sensor to a solenoid fixed to and electrically connected to a printed circuit board.

BACKGROUND OF THE INVENTION

A generally known pressure sensor device J100 of a prior art is shown in FIGS. 13 to 15, wherein FIG. 13 shows a schematic cross sectional view of the pressure sensor device J100, FIG. 14 shows a schematic cross sectional view of an assembled structure of the pressure sensor device J100 assembled to a solenoid 200 fixed to and electrically connected a printed circuit board, and FIG. 15 shows a schematic cross sectional view of the pressure sensor device J100 detached from the solenoid 200.

As shown in FIG. 13, a pressure sensor 120 is fixed to one end of an electromagnetic valve 110 of the pressure sensor device J100, to detect a fluid pressure of working fluid flowing into or flowing out of the electromagnetic valve 110. The pressure sensor device of this kind is disclosed, for example, in Japanese patent publication Nos. 2002-520211 and 2003-522677.

An actuator casing 400 is fixed to the other end of the electromagnetic valve 110, and a fluid port 410 is formed in the actuator casing 400, through which pressurized fluid is introduced into the electromagnetic valve 110, as shown in FIG. 13. Although not shown in FIGS. 13 to 15, a fluid passage for circulating the pressurized fluid is formed in the inside of the electromagnetic valve 110, and a valve member for adjusting a flow amount of the pressurized fluid is movably arranged in the fluid passage.

The fluid pressure of the pressurized fluid is detected by the pressure sensor 120, when the pressurized fluid is introduced into the electromagnetic valve 110 through the fluid port 410 and the pressure thereof is applied to the pressure sensor 120. During this detection operation, the valve member in the electromagnetic valve 110 is operated by the electromagnetic force to control the flow amount of the pressurized fluid.

In the pressure sensor device J100, it is not necessary to electrically connect the electromagnetic valve 110 with an outside electrical power supply source, since the electromagnetic valve (more specifically, the movable valve member provided therein) is driven by the electromagnetic force to be applied from the outside of the electromagnetic valve 110. On the other hand, it is necessary to electrically connect the pressure sensor 120 with an outside electrical unit to obtain detected signals from the pressure sensor 120. A structure of the electrical connection is shown in FIG. 14.

As shown in FIG. 14, multiple terminals J101 of the pressure sensor 120 are connected to a printed circuit board 300 by a suitable method, such as soldering, welding, press-fitting, contact, or the like. The electrical connection between the terminals J101 and the printed circuit board can be also achieved by means of an electrical connector.

The solenoid 200 generates the electromagnetic force to drive the electromagnetic valve 110, and it is formed into a cylindrical shape, wherein an electromagnetic coil 210 made of electrically conductive wires is housed in the solenoid.

The solenoid 200 comprises a pair of solenoid terminals 220, through which the solenoid 200 is electrically connected to the printed circuit board, so that electrical power is supplied from the printed circuit board 300 to the solenoid 200 through the solenoid terminals 220.

When the pressure sensor device J100 is assembled to the solenoid 200, the pressure sensor 120 and the electromagnetic valve 110 are inserted into an inside space of the solenoid 200, as shown in FIG. 14. In this assembled condition, the pressure sensor 120 is electrically connected to the printed circuit board 300.

As shown in FIG. 15, when the pressure sensor device J100 is to be detached from the solenoid 200, the electrical connection between the pressure sensor 120 and the printed circuit board 300 must be at first released and then the pressure sensor device J100 is drawn out of the solenoid 200.

It becomes necessary to detach the pressure sensor device J100 from the solenoid 200, when electrical patterns on the printed circuit board 300 are to be repaired or exchanged, or the like.

When the pressure sensor device J100 is to be detached from the solenoid 200, the electrical connection between the pressure sensor 120 and the printed circuit board 300 must be at first released, as explained above. When the pressure sensor device J100 is assembled to the solenoid after being repaired, the terminals J101 must be electrically connected to the printed circuit board 300 again by a soldering process, a welding process or the like, after the pressure sensor device J100 is inserted into the solenoid 200. As above, a larger number of steps is required for repairing or exchanging the printed circuit board.

SUMMARY OF THE INVENTION

The present invention is made in view of the above problems. It is, therefore, an object of the present invention to provide a pressure sensor device which can be easily assembled to or disassembled from a solenoid connected to a printed circuit board. More specifically, it is an object of the present invention to provide an assembling structure for assembling a pressure sensor device to a solenoid fixed to a printed circuit board, according to which an increase of design limitations and an increase of man power or steps for assembling and disassembling processes can be suppressed.

According to a feature of the present invention, a pressure sensor device comprises an electromagnetic valve and a pressure sensor fixed to one end of the electromagnetic valve, wherein the pressure sensor detects a fluid pressure of a working fluid flowing out of or flowing into the electromagnetic valve. The pressure sensor device is inserted into a cylindrical inner space of a solenoid, which is electrically connected to an electrical circuit device. The solenoid generates an electromagnetic force to operate the electromagnetic valve. A first set of terminals is provided to the pressure sensor, whereas a second set of terminals is provided to the solenoid. The second set of the terminals is electrically connected to the electrical circuit device. The pressure sensor device is assembled to the solenoid in such a manner that the first and second sets of the terminals are respectively and electrically connected to each other, wherein the first set of the terminals is detachable from the second set of the terminals.

According to another feature of the present invention, the first and second sets of the terminals are electrically connected to each other through spring contact.

According to a further feature of the present invention, the first and second sets of the terminals are connected to each other in an electrical signal transmitting manner by use of electromagnetic wave.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
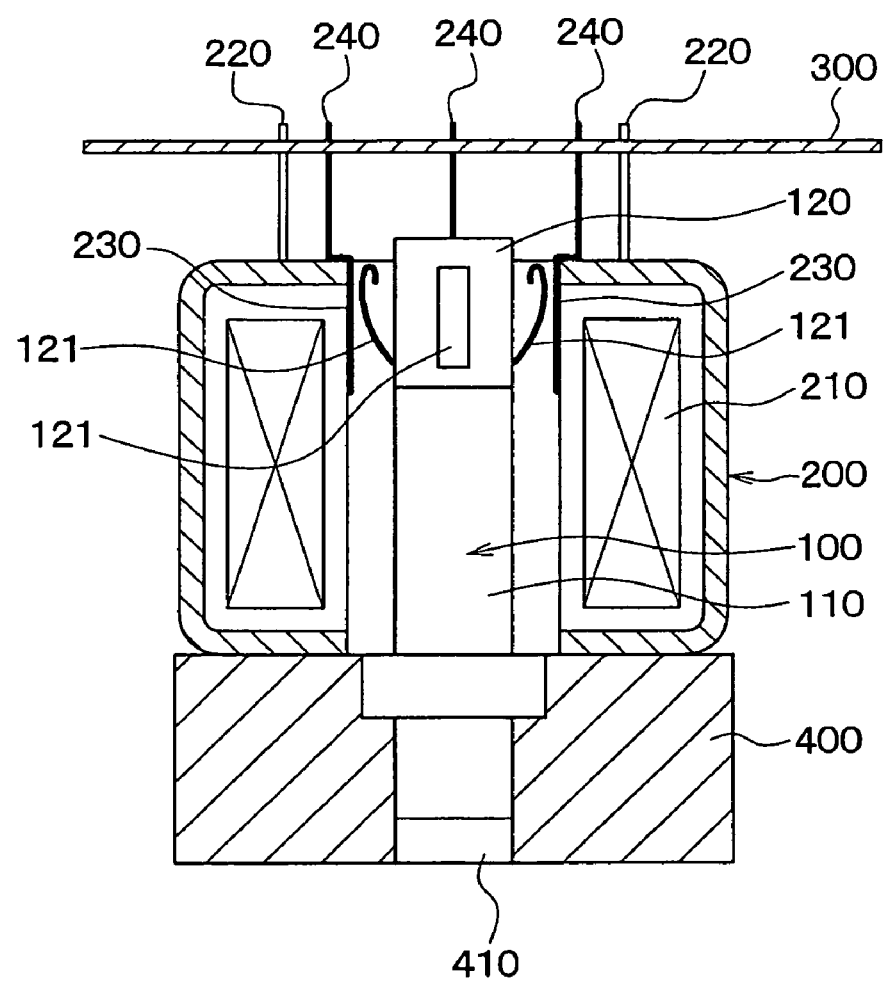
FIG. 1 is a schematic cross sectional view of an assembling structure of a pressure sensor device assembled to a solenoid, according to a first embodiment of the present invention.

The present invention is explained with reference to the drawings. In the following description and the drawings, the same reference numerals are used for the same or similar portions.

First Embodiment

Figure 2:
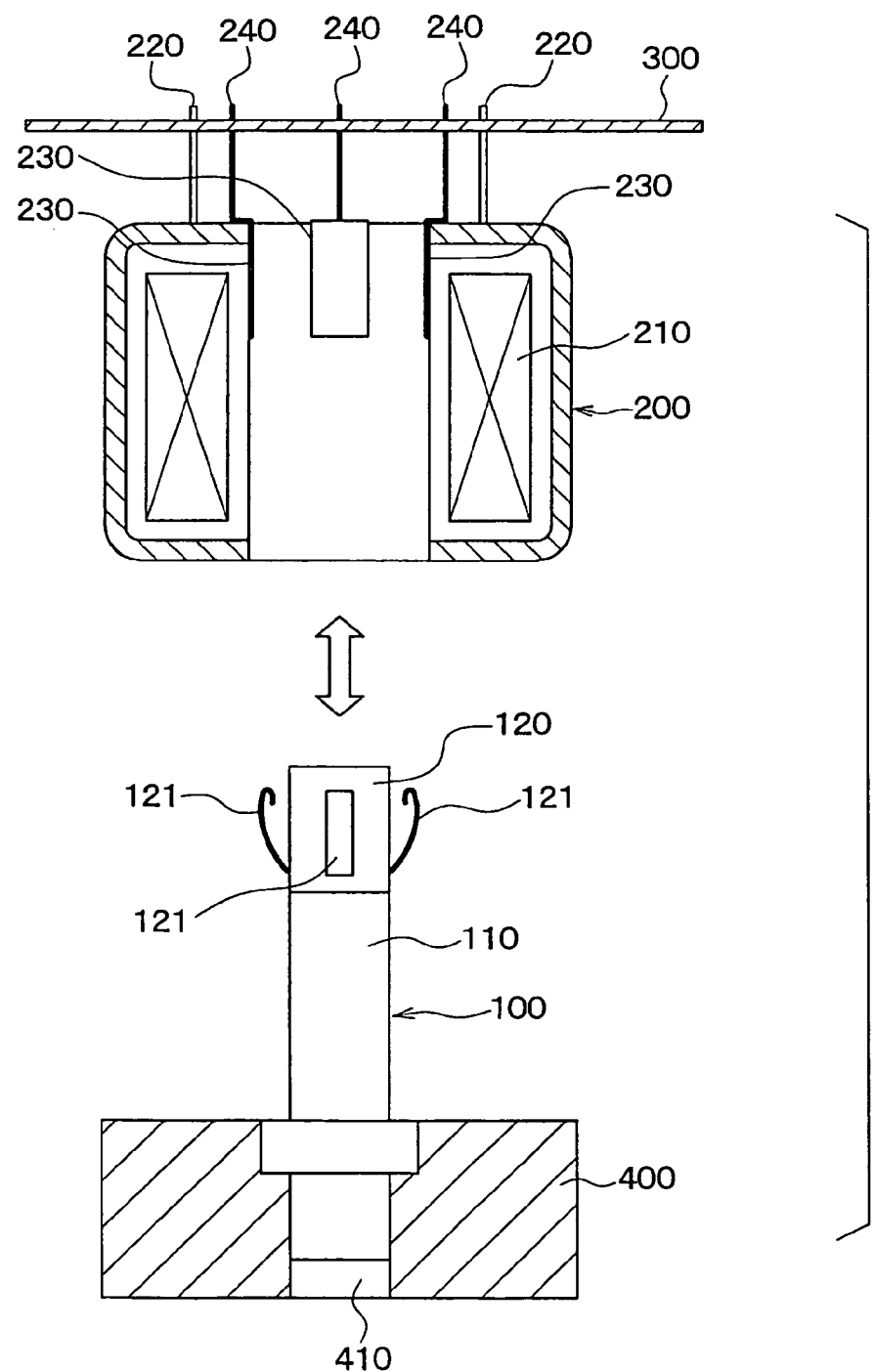
FIG. 2 is a schematic cross sectional view showing the pressure sensor device detached from the solenoid.

FIG. 1 is a schematic cross sectional view of an assembling structure according to a first embodiment of the present invention, in which a pressure sensor device 100 having an electromagnetic valve is assembled to a solenoid 200 fixed to and electrically connected to an electrical circuit device 300, such as a printed circuit board 300. FIG. 2 is a schematic cross sectional view showing the pressure sensor device 100 detached from the solenoid 200.

The pressure sensor device 100 of this invention is, for example, used for a braking actuator of a motor vehicle to detect a fluid pressure of a working fluid (that is a braking fluid).

Figure 3:
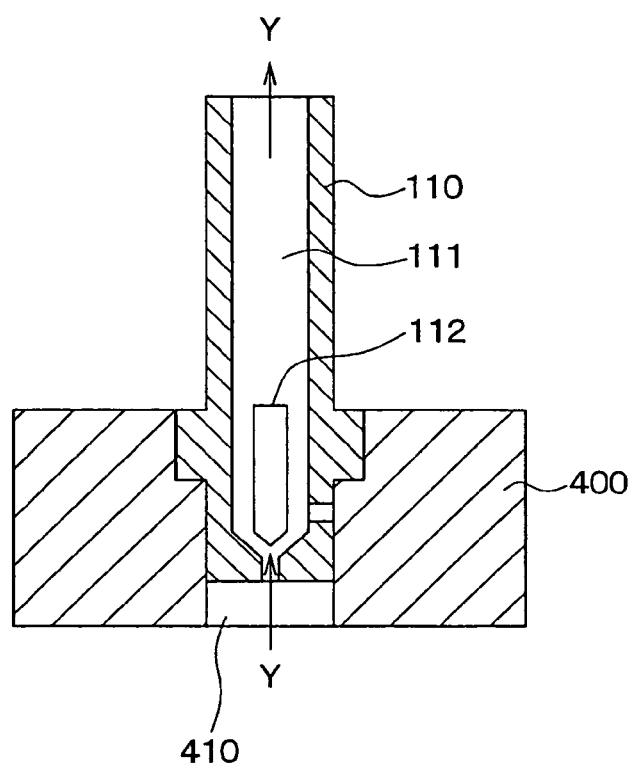
FIG. 3 is a schematic cross sectional view showing an inside structure of an electromagnetic valve.

The pressure sensor device 100 comprises an electromagnetic valve 110 and a pressure sensor 120 fixed to one end of the electromagnetic valve, wherein the electromagnetic valve and the pressure sensor are integrally formed as one unit, as shown in FIG. 1. FIG. 3 is a schematic cross sectional view showing an inside structure of the electromagnetic valve 110.

An actuator casing 400 is fixed to the other end of the electromagnetic valve 110, and a fluid port 410 is formed in the actuator casing 400 to introduce a pressurized fluid into the inside of the electromagnetic valve 110. The other end of the electromagnetic valve 110 is inserted into the fluid port 410 and fixed to the actuator casing 400 by any suitable means, such as caulking, a bobby pin or the like.

As shown in FIG. 3, a fluid passage 111, through which the braking fluid of the pressurized fluid flows, is formed in the inside of the electromagnetic valve 110 and a valve member 112 is movably arranged in the fluid passage 111 for controlling a flow amount of the braking fluid flowing through the fluid passage 111. The valve member 112 is movable in a vertical direction in the drawing by electromagnetic force generated by the solenoid 200, and the valve member 112 is formed into a needle shape.

As indicated by arrows Y in FIG. 3, the pressurized fluid is introduced into the fluid passage 111 through the fluid port 410, and applied to the pressure sensor 120.

The fluid pressure of the pressurized fluid is then detected by the pressure sensor 120. During this detection operation, the valve member 112 is operated by the electromagnetic force generated at the solenoid 200 to control the flow amount of the pressurized fluid.

The pressure sensor 120 is firmly fixed to the one end of the electromagnetic valve 110, for example, by a welding or brazing method. In the embodiment, the electromagnetic valve 110 and the pressure sensor 120 are formed into a cylindrical shape.

The pressure sensor 120 comprises, for example, a piezoelectric type, electrostatic capacity type sensor, or the like, to output an electrical signal corresponding to a pressure level of the pressurized fluid to be introduced and applied to the pressure sensor 120.

The pressure to be detected by the pressure sensor 120 is not limited to the pressure of the pressurized fluid supplied to the pressure sensor 120 through the electromagnetic valve 110, but the pressure of the pressurized fluid before flowing into the electromagnetic valve 110. Namely, either one of or the both of the pressures of the pressurized fluid after passing through or before entering into the electromagnetic valve 110 can be detected by the pressure sensor 120, wherein the flow amount of the pressurized fluid is controlled by the electromagnetic valve 110.

The solenoid 200 generates the electromagnetic force to drive the electromagnetic valve 110, more specifically to operate the valve member 112. The solenoid 200 is formed into a cylindrical shape having a cylindrical inner space, and an electromagnetic coil 210 made of electrically conductive wires is housed in the solenoid.

The solenoid 200 comprises a pair of solenoid terminals 220, the forward ends of which are inserted into holes formed in the electrical circuit device 300 (hereinafter also referred to as the printed circuit board 300) and electrically connected thereto by the welding or brazing method or the like.

The printed circuit board 300 is a well known board on which electrical patterns of conductive material or bus bars are formed. An electric power is supplied to the coil 210 of the solenoid 200 through the solenoid terminals 220.

Multiple spring terminals 121 are provided at the pressure sensor 120 of the sensor device 100, for obtaining the electrical signals therefrom. The spring terminals 121 are arranged at such positions at which the spring terminals 121 face to an inner surface of the solenoid 200. Furthermore, the multiple spring terminals 121 are displaced from one another in a circumferential direction of the pressure sensor 120.

The spring terminals 121 are made of electrically conductive spring material, having a spring force (namely, deformable) in a radial direction of the cylindrically formed pressure sensor 120, and fixed to an outer surface of the pressure sensor 120 by the welding or brazing method, or the like. The terminals provided to the pressure sensor 120 are also referred to as a first set of terminals.

Flat terminals 230, which are made of electrically conductive material, are fixed to the inner surface of the solenoid 200 by adhesive material or the like, at such portions facing to the spring terminals 121. The flat terminals are likewise displaced from one another in the circumferential direction. The flat terminals 230 are longitudinally extended toward the printed circuit board 300 to form sensor terminals 240, as in the same manner to the solenoid terminals 220. The terminals provided to the solenoid 200 are also referred to as a second set of terminals.

The forward ends of the sensor terminals 240 are inserted into respective holes formed in the printed circuit board 300 and electrically connected to the printed circuit board 300 by the welding or brazing method, or the like. The flat terminals 230 are electrically connected to the printed circuit board 300 through the sensor terminals 240.

As shown in FIG. 1, when the pressure sensor device 100 (the pressure sensor 120 and the electromagnetic valve 110) is inserted into the cylindrical inner space of the solenoid 200, the spring terminals (the first set of the terminals) 121 are inwardly deformed, so that the first set of the terminals 121 is electrically connected to the second set of the terminals 230. As a result, the pressure sensor device 100 is electrically connected to the printed circuit board 300. As above, the spring terminals 121 are electrically connected to the flat terminals 230 by use of the spring reaction force of the spring terminals 121.

According to the above embodiment, the solenoid 200 is electrically connected to the printed circuit board 300 through the solenoid terminals 220, whereas the pressure sensor device 100 is electrically connected to the printed circuit board 300 through the spring terminals 121 and the flat terminals 230. Namely, the electrical connection between the pressure sensor device 100 and the printed circuit board 300 can be obtained by simply inserting the pressure sensor device 100 (the pressure sensor 120 and the electromagnetic valve 110) into the cylindrical inner space of the solenoid 200.

In the pressure sensor device 100, as assembled in the above manner, the pressure of the braking fluid is controlled by the electromagnetic valve 110 which is driven by the solenoid 200, and the fluid pressure is detected by the pressure sensor 120. The electrical signals from the pressure sensor 120 are outputted to the printed circuit board 300 through the spring terminals 121 and the flat terminals 230.

As shown in FIG. 2, the pressure sensor device 100 can be easily detached from the solenoid 200, by simply drawing the pressure sensor device 100 from the solenoid 200.

Since the spring terminals 121 and the flat terminals 230 are detachably contacted with each other by means of spring contact, the pressure sensor device 100 can be easily detached from the solenoid 200.

The increase of man power or the increase of the limitation to the design of the structure for the pressure sensor device can be suppressed.

Second Embodiment

Figure 4:
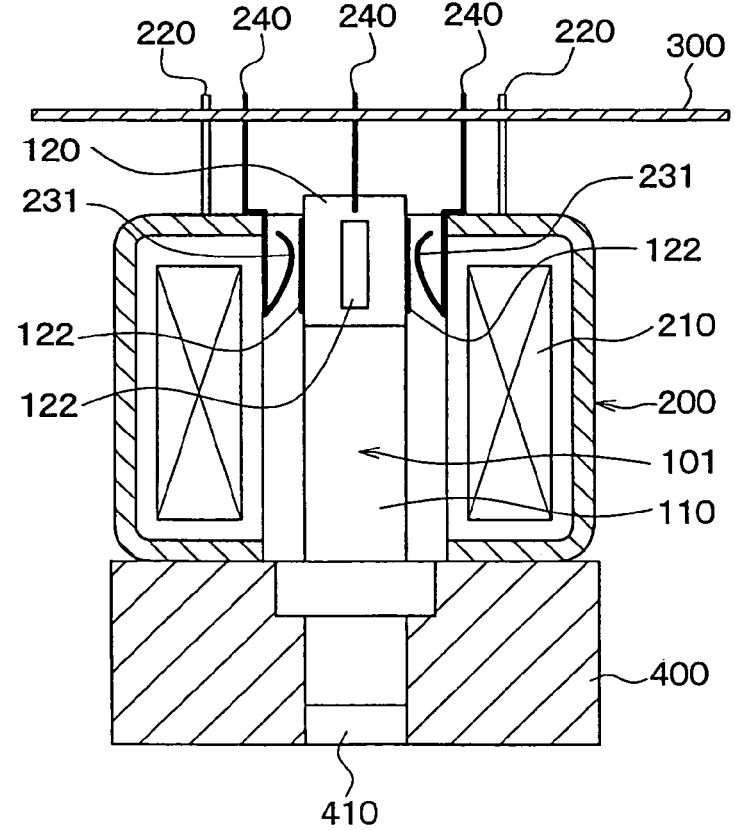
FIG. 4 is a schematic cross sectional view of an assembling structure of a pressure sensor device according to a second embodiment of the present invention.
Figure 5:
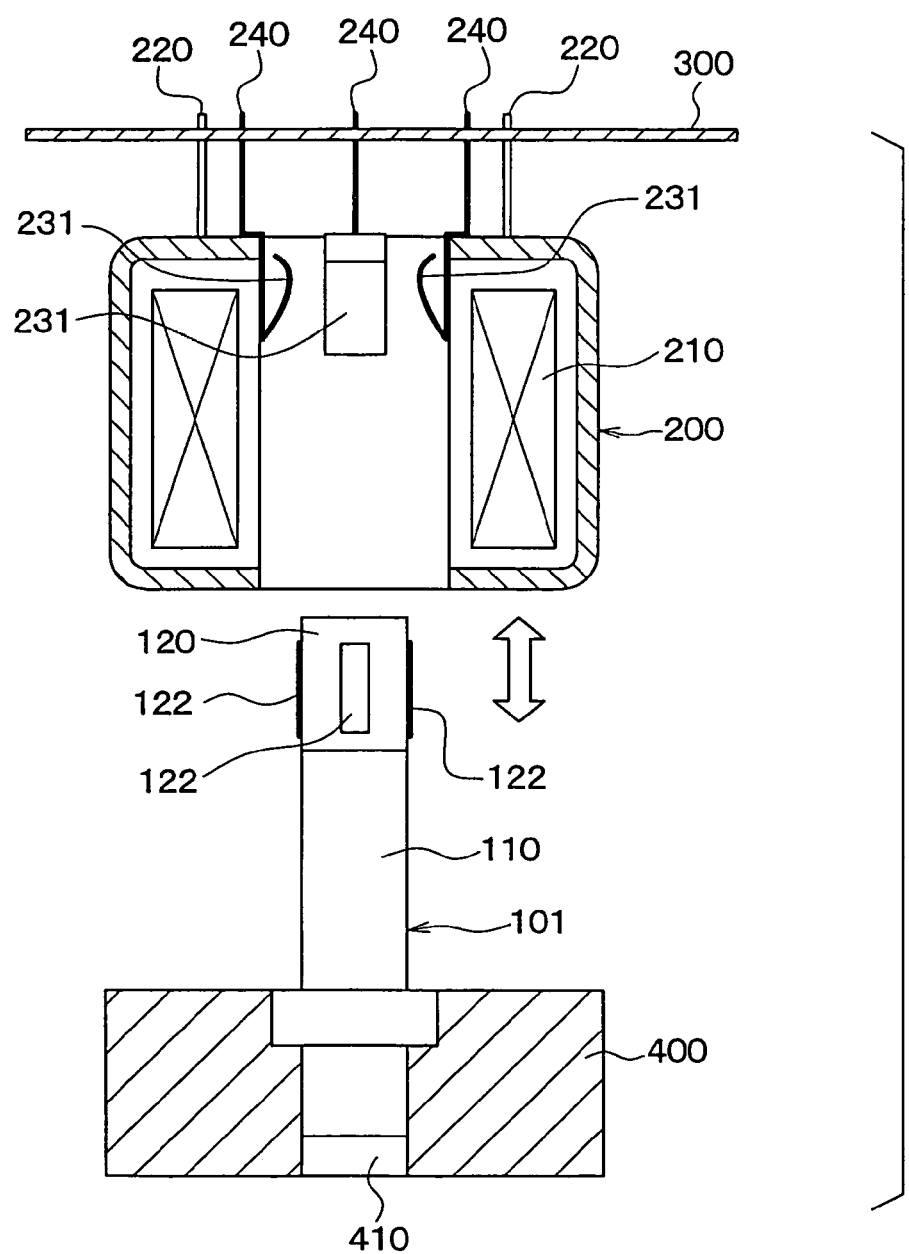
FIG. 5 is a schematic cross sectional view showing the pressure sensor device detached from a solenoid, according to the second embodiment.

FIG. 4 is a schematic cross sectional view of an assembling structure according to a second embodiment of the present invention, in which a pressure sensor device 101 having the electromagnetic valve 110 is assembled to the solenoid 200 fixed to and electrically connected to the printed circuit board 300. FIG. 5 is a schematic cross sectional view showing the pressure sensor device 101 detached from the solenoid 200.

According to the second embodiment, which differ from the first embodiment in the structure of the electrical connection between the pressure sensor and the printed circuit board, flat terminals 122 are provided on the pressure sensor 120, whereas spring terminals 231 are provided at the inner surface of the solenoid 200.

The flat terminals 122 and the spring terminals 231 are fixed to the pressure sensor 120 and the solenoid 200 by the welding or brazing method, or the like. The spring terminals 231 are made of electrically conductive spring material, having a spring force in a radial direction of the cylindrically formed solenoid 200.

As above, according to the above second embodiment, the solenoid 200 is fixed to and electrically connected to the printed circuit board 300 through the solenoid terminals 220, whereas the pressure sensor device 101 is detachably assembled to the solenoid 200, so that the pressure sensor 120 is electrically connected to the printed circuit board 300 through the flat terminals 122 and the spring terminals 231.

Third Embodiment

Figure 6:
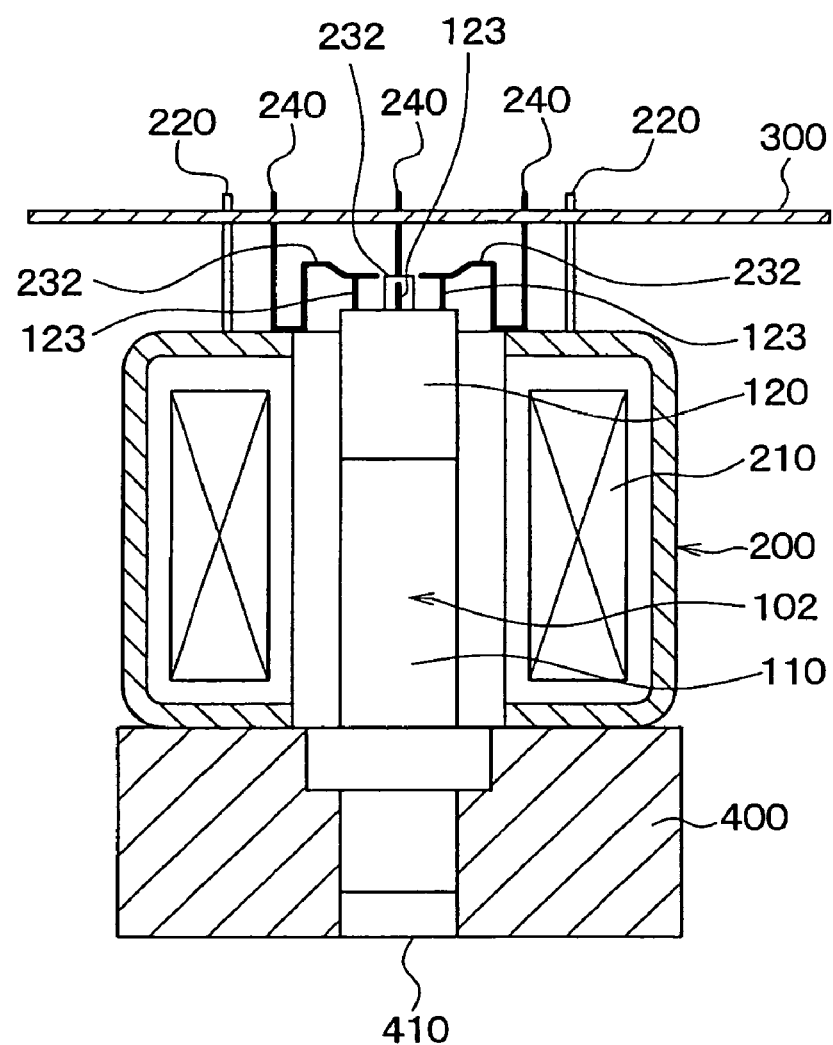
FIG. 6 is a schematic cross sectional view of an assembling structure of a pressure sensor device according to a third embodiment of the present invention.
Figure 7:
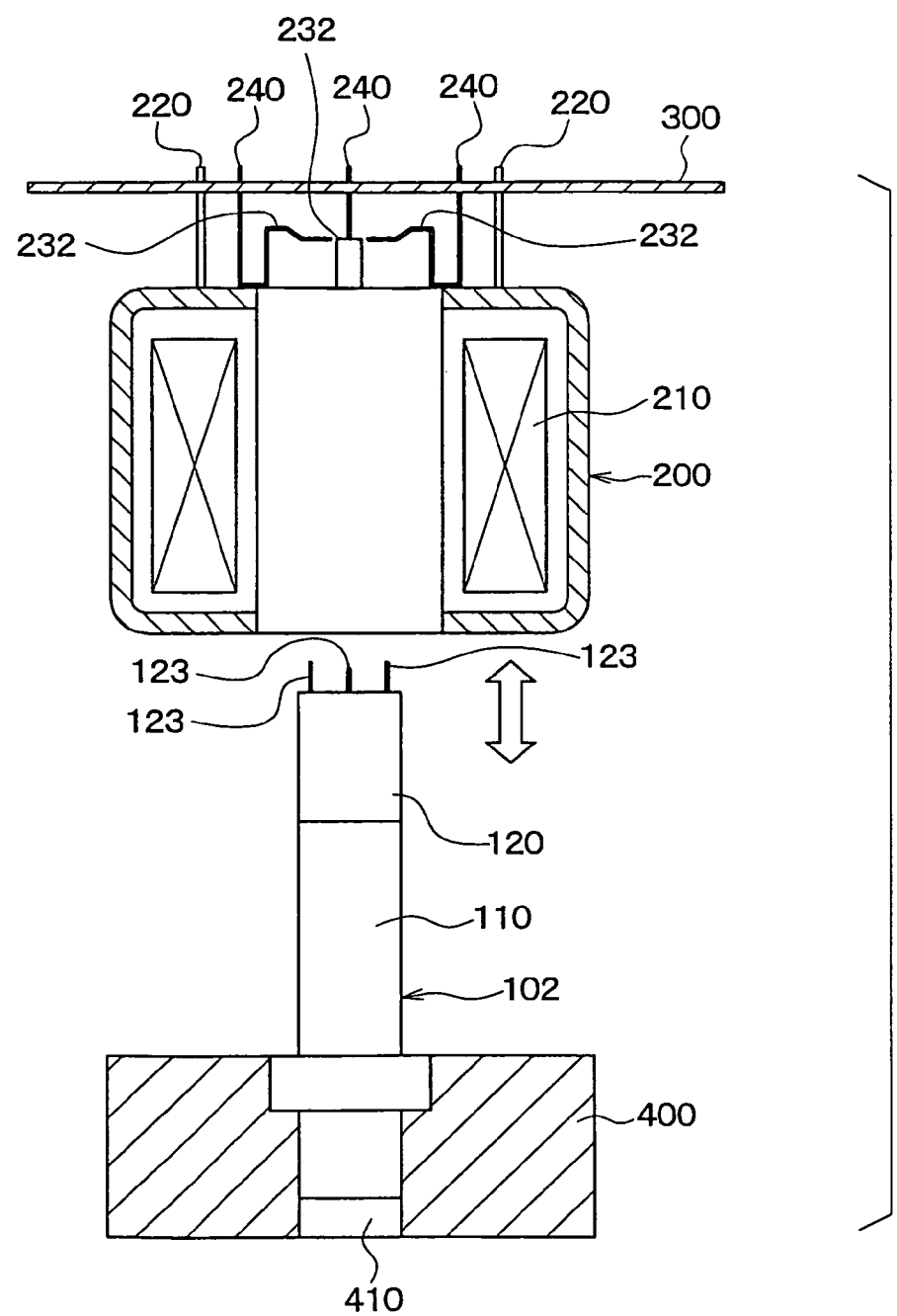
FIG. 7 is a schematic cross sectional view showing the pressure sensor device detached from a solenoid, according to the third embodiment.

FIG. 6 is a schematic cross sectional view of an assembling structure according to a third embodiment of the present invention, in which a pressure sensor device 102 having the electromagnetic valve 110 is assembled to the solenoid 200 fixed to and electrically connected to the printed circuit board 300. FIG. 7 is a schematic cross sectional view showing the pressure sensor device 102 detached from the solenoid 200.

In the above first and second embodiments, the flat terminals and spring terminals are arranged to face to each other in the radial direction of the pressure sensor device 100 (i.e. at the inner surface of the solenoid and the outer surface of the pressure sensor), so that spring contact force is applied from the spring terminals to the flat terminals in the radial direction.

According to the third embodiment, as shown in FIGS. 6 and 7, multiple longitudinally extending pin terminals 123 are provided at a top end portion of the pressure sensor 120, whereas multiple spring terminals 232 are provided at one end surface of the solenoid 200, so that each forward end of the spring terminals 232 extend inwardly in the radial direction.

The spring terminals 232 are made of electrically conductive spring material, having a spring force in a longitudinal direction of the cylindrically formed solenoid 200. The spring terminals 232 are displaced from one another in a circumferential direction.

When the pressure sensor device 102 is inserted into the inside space of the solenoid 200, the top ends of the pin terminals 123 are brought into contact with the respective spring terminals 232, wherein each of the forward ends of the spring terminals 232 are moved upwardly (that is, elastically deformed in the longitudinal direction, in which the pressure sensor device 102 is inserted into the solenoid 200) to sufficiently achieve the spring contacts (the electrical contact) between the pin terminals 123 and the spring terminals 232.

The pin terminals 123 and the spring terminals 232 are respectively fixed to the pressure sensor 120 and the solenoid 200 by the welding or brazing method, or the like.

As above, according to the above third embodiment, the solenoid 200 is fixed to and electrically connected to the printed circuit board 300 through the solenoid terminals 220, whereas the pressure sensor device 102 is detachably assembled to the solenoid 200, so that the pressure sensor 120 is electrically connected to the printed circuit board 300 through the pin terminals 123 and the spring terminals 232.

Fourth Embodiment

Figure 8:
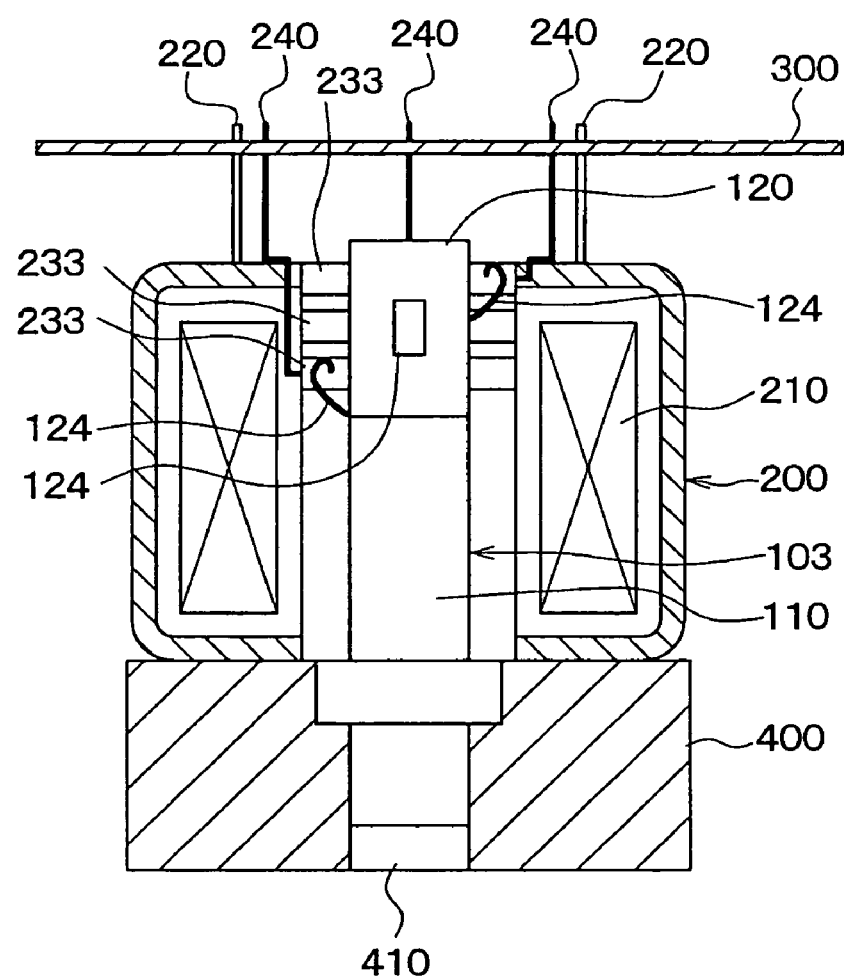
FIG. 8 is a schematic cross sectional view of an assembling structure of a pressure sensor device according to a fourth embodiment of the present invention.
Figure 9:
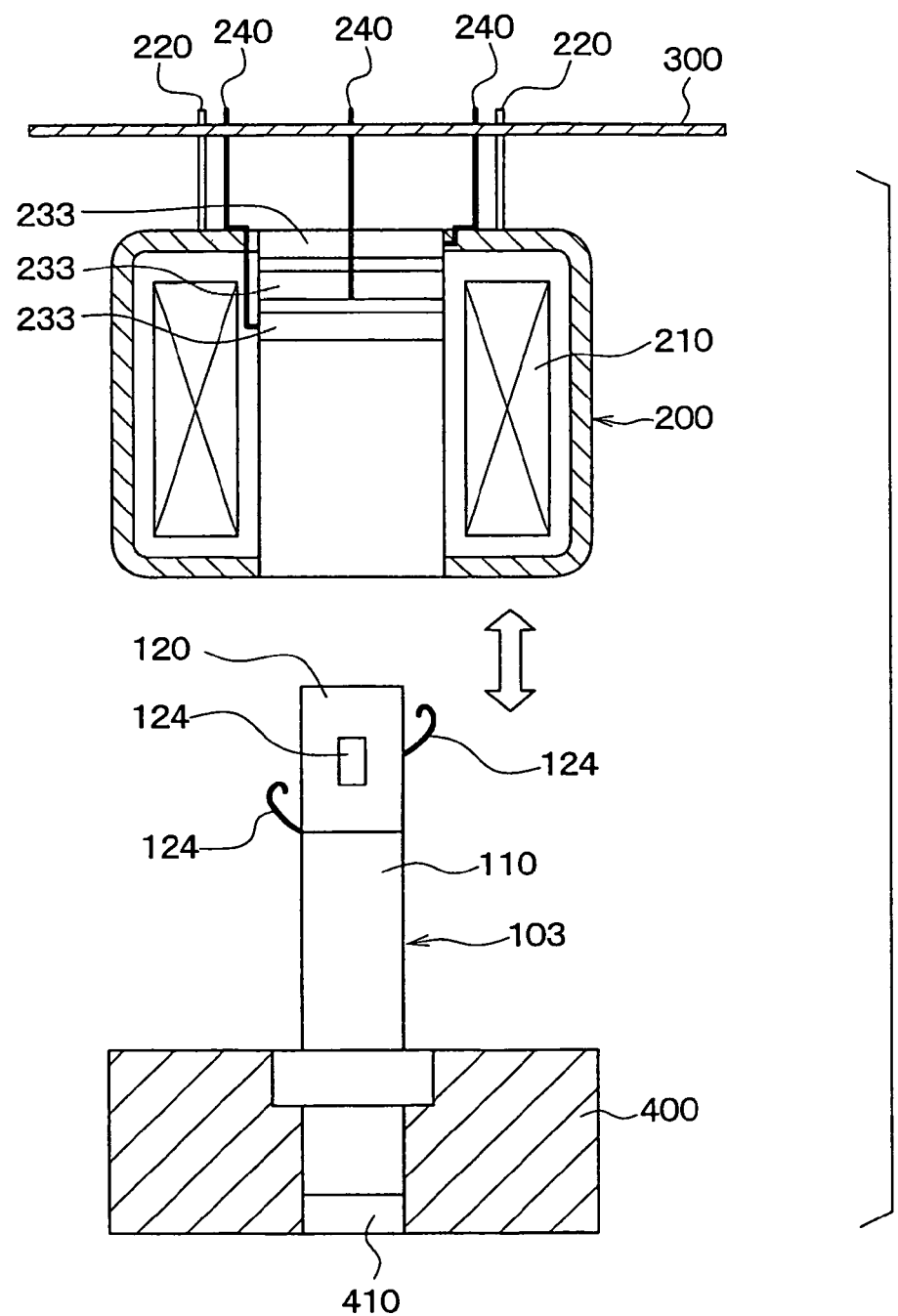
FIG. 9 is a schematic cross sectional view showing the pressure sensor device detached from a solenoid, according to the fourth embodiment.

FIG. 8 is a schematic cross sectional view of an assembling structure according to a fourth embodiment of the present invention, in which a pressure sensor device 103 having the electromagnetic valve 110 is assembled to the solenoid 200 fixed to and electrically connected to the printed circuit board 300. FIG. 9 is a schematic cross sectional view showing the pressure sensor device 103 detached from the solenoid 200.

In the above first to third embodiments, the terminals provided at the pressure sensor device and the terminals provided at the solenoid are respectively arranged to face to each other.

Accordingly, it is necessary to exactly position the pressure sensor device with respect to the solenoid, namely it is necessary to rotate the pressure sensor device with respect to the solenoid, in order that the respective terminals of the pressure sensor device and the solenoid are brought into contact at right positions.

According to the fourth embodiment, as shown in FIGS. 8 and 9, multiple spring terminals 124 are provided to the pressure sensor device 103, in such a manner that the multiple spring terminals 124 are displaced from one another in the longitudinal direction.

Multiple terminals 233, which are formed into a ring shape, are provided at the inner surface of the solenoid 200 and displaced from one another in the longitudinal direction of the solenoid 200, so that the respective ring shaped terminals 233 face to (and brought into contact with) the respective spring terminals 124 of the pressure sensor 120 when the pressure sensor device 103 is assembled to the solenoid 200.

According to the above fourth embodiment, it is not necessary to position (i.e. to rotate) the pressure sensor device 103 with respect to the solenoid 200, when it is assembled to the solenoid 200.

The fourth embodiment can be modified in such a manner that the terminals 124 of the pressure sensor 120 can formed into ring shaped terminals, whereas the ring shaped terminals 233 of the solenoid 200 can be made of the spring terminals, as in the similar manner to the second embodiment shown in FIGS. 4 and 5.

Fifth Embodiment

Figure 10:
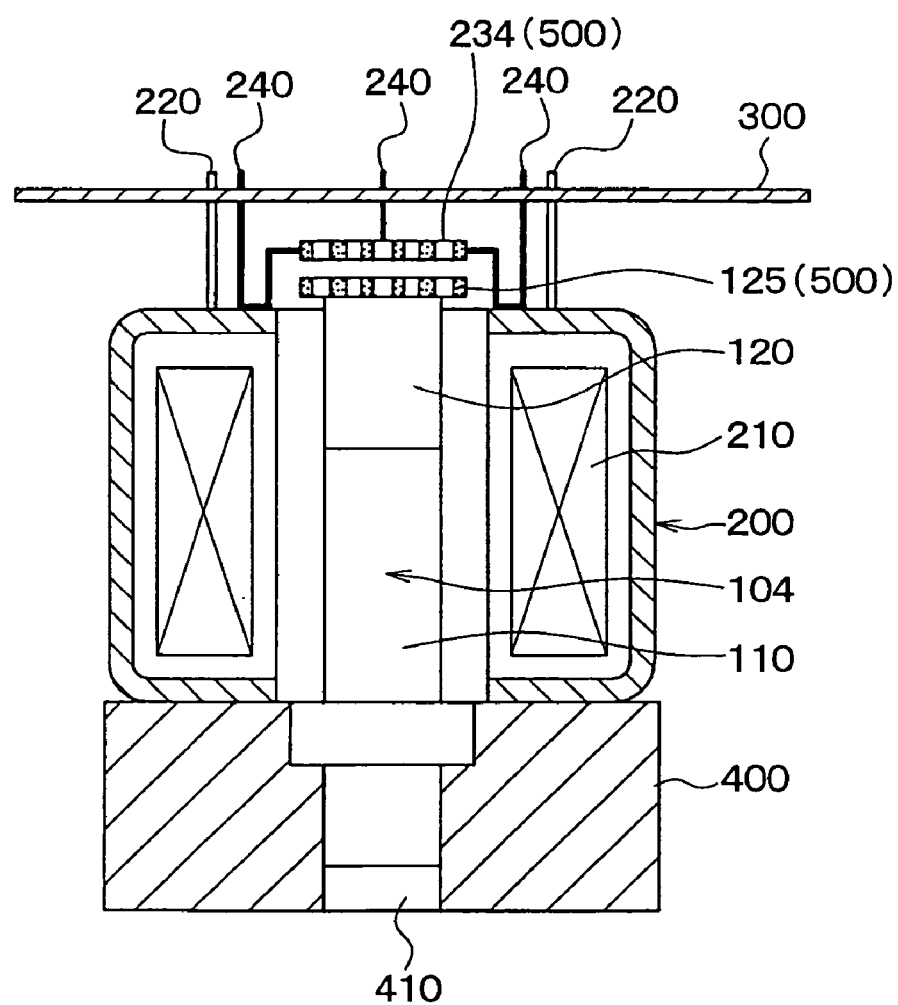
FIG. 10 is a schematic cross sectional view of an assembling structure of a pressure sensor device according to a fifth embodiment of the present invention.
Figure 11:
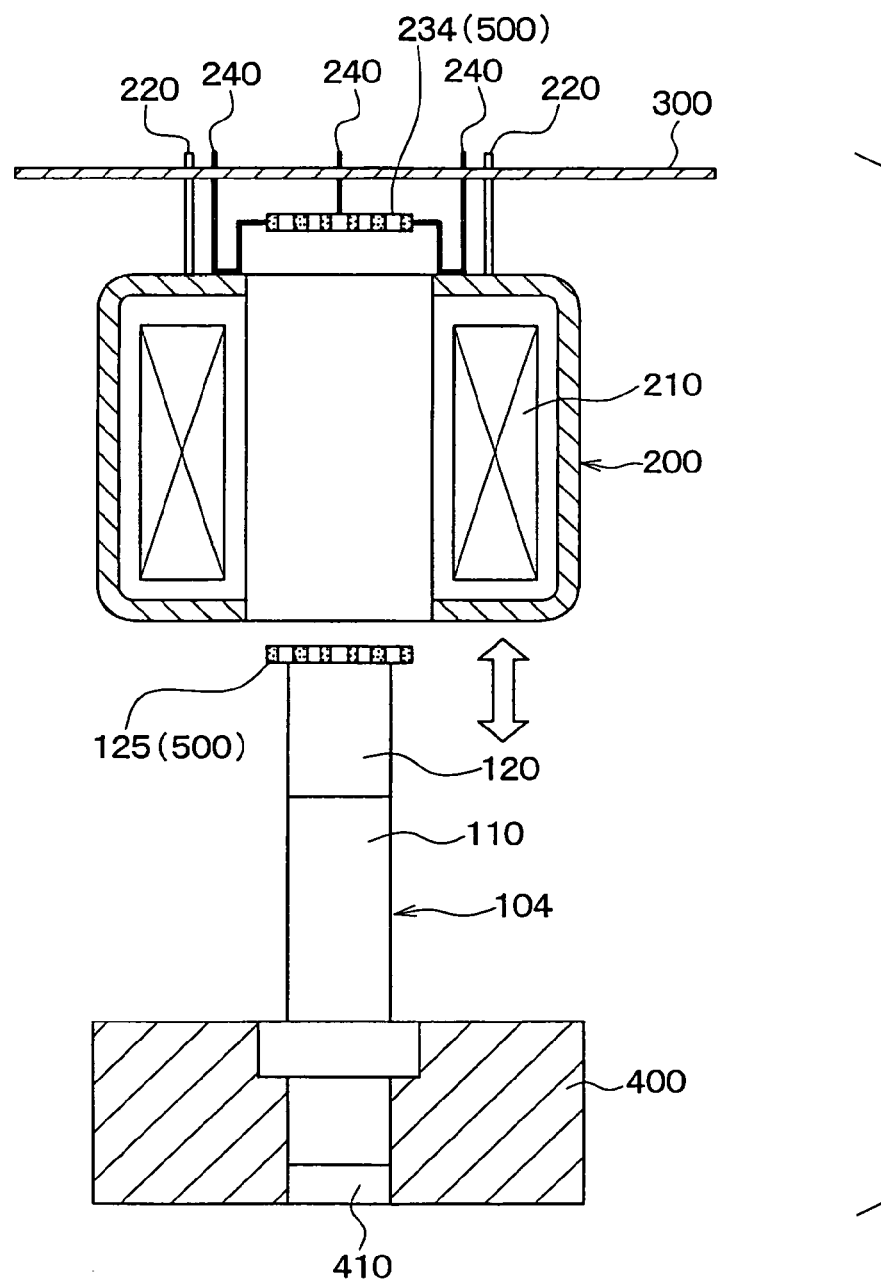
FIG. 11 is a schematic cross sectional view showing the pressure sensor device detached from a solenoid, according to the fifth embodiment.

FIG. 10 is a schematic cross sectional view of an assembling structure according to a fifth embodiment of the present invention, in which a pressure sensor device 104 having the electromagnetic valve 110 is assembled to the solenoid 200 fixed to and electrically connected to the printed circuit board 300. FIG. 11 is a schematic cross sectional view showing the pressure sensor device 104 detached from the solenoid 200.

In the above first to fourth embodiments, the electrical connection between the pressure sensor and the printed circuit board is achieved by the contact-type connection (the spring contact).

According to the fifth embodiment, as shown in FIGS. 10 and 11, a terminal portion 125 of the pressure sensor 120 is electrically connected to a terminal portion 234 of the solenoid 200 by means of electromagnetic wave, as a contact-less type electrical connection.

Figure 12:
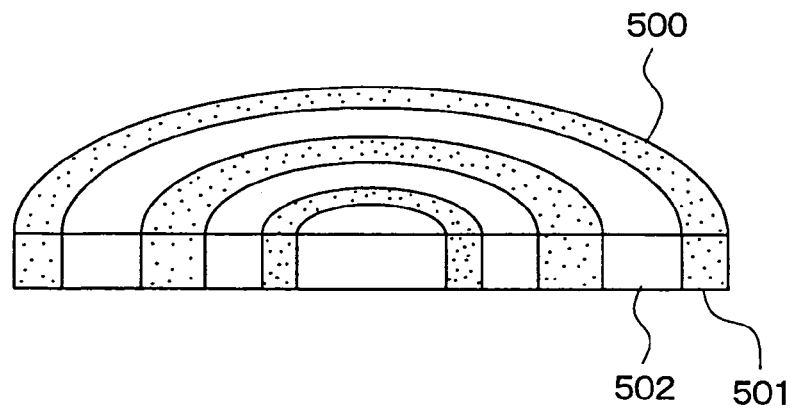
FIG. 12 is a schematic perspective view partly showing a transformer as terminal portions.
Figure 13:
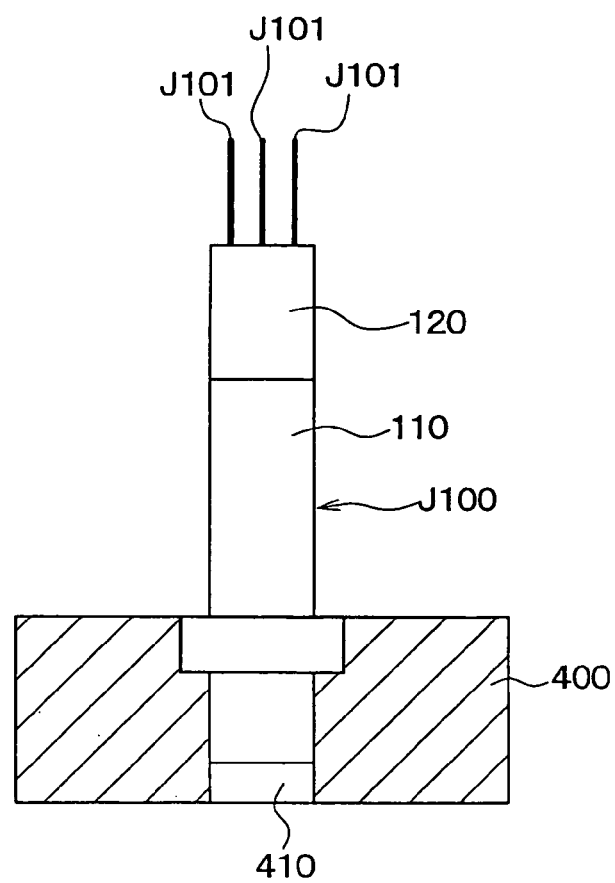
FIG. 13 is a schematic cross sectional view showing a pressure sensor device of a prior art.
Figure 14:
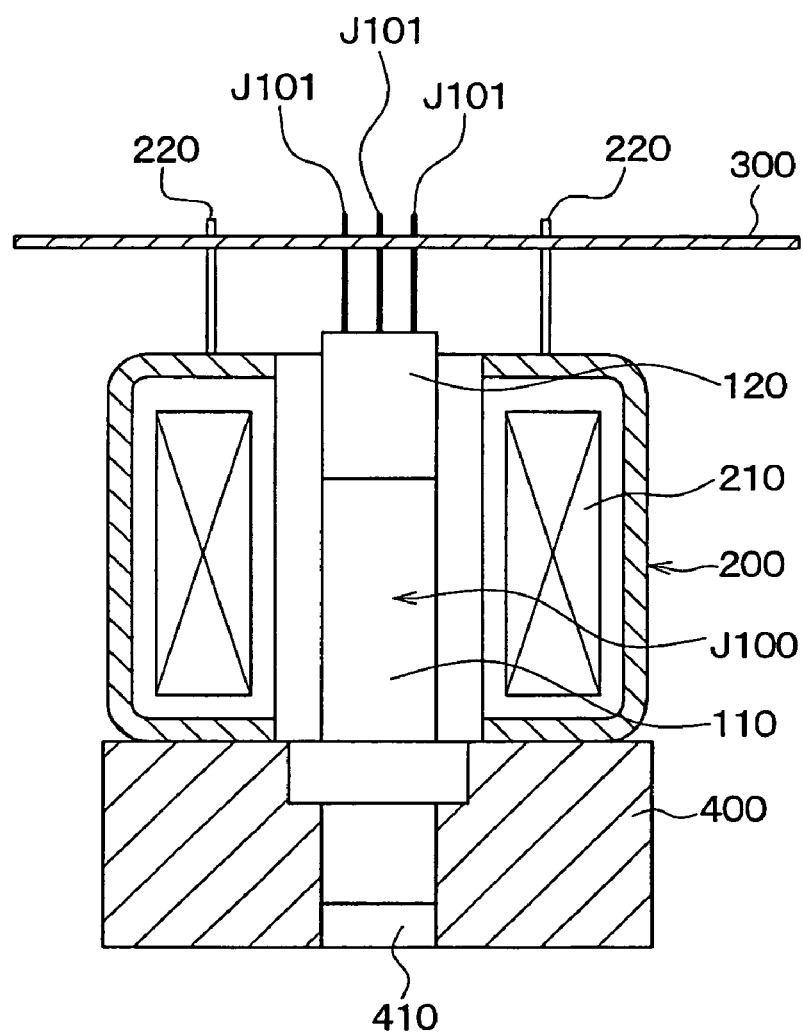
FIG. 14 is a schematic cross sectional view of an assembling structure of a pressure sensor device of the prior art.
Figure 15:
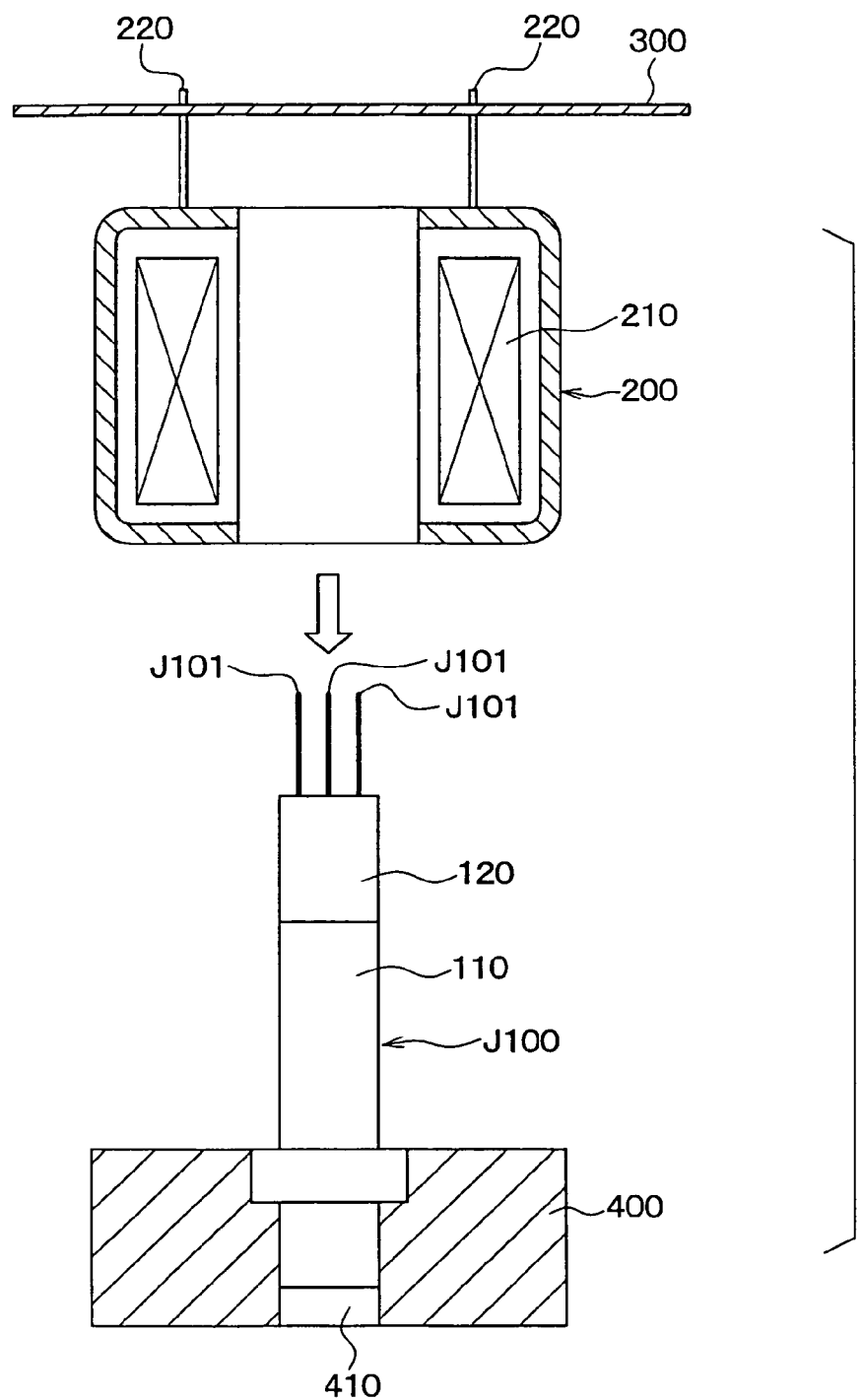
FIG. 15 is a schematic cross sectional view showing the pressure sensor device of the prior art, which is detached from a solenoid.

The terminal portion 125 of the pressure sensor 120 as well as the terminal portion 234 of the solenoid 200 is formed as a transformer 500. FIG. 12 is a schematic perspective view partly showing the terminal portions, namely a semi-circular portion of the transformer 500.

The transformer 500 is formed as a coil shape, which comprises electrically conductive portions 501 made of cupper and electrically insulating portions 502 made of synthetic resin or ceramic material, wherein the portions 501 and 502 are formed as concentric circles.

The terminal portion 125 (the transformer 500) of the pressure sensor side faces to the terminal portion 234 (the transformer 500) of the solenoid side, when the pressure sensor device 104 is assembled to the solenoid 200. The electrical signals from the pressure sensor 120 can be transmitted to the printed circuit board 300 through the contact-less electrical connection by means of the electromagnetic wave (magnetic lines).

The signal transmission can be further achieved by use of a photo-coupler, so that the signals from the pressure sensor can be transmitted to the printed circuit board 300 through the contact-less signal transmitting device.

As above, according to the above fifth embodiment, the solenoid 200 is fixed to and electrically connected to the printed circuit board 300 through the solenoid terminals 220, whereas the pressure sensor device 104 is detachably assembled to the solenoid 200, so that the signals from the pressure sensor 120 are transmitted to the printed circuit board 300 through the contact-less signal transmitting device, and thereby the same effect to the first embodiment can be also obtained in this fifth embodiment.

What is claimed is:

1. An assembling structure comprising:
   a pressure sensor device having an electromagnetic valve and a pressure sensor fixed to one end of the electromagnetic valve, wherein the pressure sensor detects a fluid pressure of a working fluid flowing out of or flowing into the electromagnetic valve;
   a solenoid having a cylindrical inner space and generating an electromagnetic force to operate the electromagnetic valve; and an electrical circuit device electrically connected to the solenoid, wherein the pressure sensor and the electromagnetic valve of the pressure sensor device is inserted into the cylindrical inner space of the solenoid, and the pressure sensor is electrically connected to the electrical circuit device, wherein a first set of terminals is provided to the pressure sensor and a second set of terminals is provided to the solenoid, each one end of the second set of the terminals being electrically connected to the electrical circuit device, wherein the pressure sensor device is assembled to the solenoid in such a manner that each of the first set of the terminals is respectively and electrically connected to the second set of the terminals and that the first set of the terminals is detachable from the second set of the terminals.

2. An assembling structure according to claim 1, wherein the first and second sets of the terminals are electrically connected to each other through spring contacts.

3. An assembling structure according to claim 1, wherein the first and second sets of the terminals are connected to each other in an electrical signal transmitting manner by use of electromagnetic wave.

4. An assembling structure according to claim 1, wherein the first set of the terminals is formed from multiple spring terminals respectively provided on an outer surface of the pressure sensor, the multiple spring terminals being circumferentially displaced from one another and elastically deformable in a radial direction, the second set of the terminals is formed from multiple flat terminals respectively provided on an inner surface of the solenoid, the multiple flat terminals being circumferentially displaced from one another, to respectively face to the first set of the terminals, when the pressure sensor device is assembled to the solenoid, and each of the spring terminals is outwardly biased in the radial direction, so that the spring terminals are brought into contact with the second set of the terminals by spring force, when the pressure sensor device is assembled to the solenoid.

5. An assembling structure according to claim 1, wherein the first set of the terminals is formed from multiple flat terminals respectively provided on an outer surface of the pressure sensor, the multiple flat terminals being circumferentially displaced from one another, the second set of the terminals is formed from multiple spring terminals respectively provided on an inner surface of the solenoid, the multiple spring terminals being circumferentially displaced from one another and elastically deformable in a radial direction, to respectively face to the first set of the terminals, when the pressure sensor device is assembled to the solenoid, and each of the spring terminals is inwardly biased in the radial direction, so that the spring terminals are brought into contact with the first set of the terminals by spring force, when the pressure sensor device is assembled to the solenoid.

6. An assembling structure according to claim 1, wherein the first set of the terminals is formed from multiple pin terminals respectively provided at a forward end surface of the pressure sensor, the multiple pin terminals extending in a longitudinal direction from the forward end surface, the second set of the terminals is formed from multiple spring terminals respectively provided to the solenoid, the multiple spring terminals being circumferentially displaced from one another and elastically deformable in the longitudinal direction, to respectively face to the first set of the terminals, when the pressure sensor device is assembled to the solenoid, and each of the spring terminals is elastically deformed in the longitudinal direction, so that the spring terminals are brought into contact with the first set of the terminals by spring force, when the pressure sensor device is assembled to the solenoid.

7. An assembling structure according to claim 1, wherein the first set of the terminals is formed from multiple spring terminals respectively provided on an outer surface of the pressure sensor, the multiple spring terminals being displaced from one another in a longitudinal direction and elastically deformable in a radial direction, the second set of the terminals is formed from multiple ring shaped terminals respectively provided on an inner surface of the solenoid, the multiple ring shaped terminals being displaced from one another in the longitudinal direction, to respectively face to the first set of the terminals, when the pressure sensor device is assembled to the solenoid, and each of the spring terminals is outwardly biased in a radial direction, so that the spring terminals are brought into contact with the second set of the terminals by spring force, when the pressure sensor device is assembled to the solenoid.

8. An assembling structure according to claim 1, wherein the first set of the terminals is formed from multiple ring shaped terminals respectively provided on an outer surface of the pressure sensor, the multiple ring shaped terminals being displaced from one another in a longitudinal direction, the second set of the terminals is formed from multiple spring terminals respectively provided on an inner surface of the solenoid, the multiple spring terminals being displaced from one another in the longitudinal direction and elastically deformable in a radial direction, to respectively face to the first set of the terminals, when the pressure sensor device is assembled to the solenoid, and each of the spring terminals is inwardly biased in the radial direction, so that the spring terminals are brought into contact with the ring shaped terminals by spring force, when the pressure sensor device is assembled to the solenoid.

9. An assembling structure according to claim 1, wherein the first set of the terminals is formed from a ring shaped transformer provided on a forward end surface of the pressure sensor, the second set of the terminals is formed from another ring shaped transformer provided to the solenoid, the other ring shaped terminals being positioned to face to the first mentioned ring shaped terminals, when the pressure sensor device is assembled to the solenoid, and the electrical signals of the pressure sensor is transmitted from the first mentioned ring shaped transformer to the other transformer by means of the electromagnetic waves.

* * * * *